United States Patent [19]

Carter et al.

[11] 4,456,968
[45] Jun. 26, 1984

[54] REAL-TIME ORDINAL-VALUE FILTER UTILIZING HALF-INTERVAL RANKING

[75] Inventors: F. Anthony Carter, Canoga Park; Jacob M. Sacks, Thousand Oaks, both of Calif.

[73] Assignee: Hughes Aircraft Company, El Segundo, Calif.

[21] Appl. No.: 306,279

[22] Filed: Sep. 28, 1981

[51] Int. Cl.³ .......................... G06F 7/06; G06K 9/00
[52] U.S. Cl. ...................................... 364/900; 382/36
[58] Field of Search ... 364/200 MS File, 900 MS File; 382/30, 36–37; 340/146.2

[56] References Cited

U.S. PATENT DOCUMENTS

| | | | |
|---|---|---|---|
| 2,987,705 | 6/1961 | Mechelen | 364/900 |
| 3,328,769 | 6/1967 | Lee | 364/900 |
| 3,336,580 | 8/1967 | Armstrong | 364/900 |
| 3,428,946 | 2/1969 | Batcher | 364/900 |
| 3,444,523 | 5/1969 | Dirks | 364/900 |
| 3,505,653 | 4/1970 | Kautz | 364/900 |
| 3,587,057 | 6/1971 | Armstrong | 364/900 |
| 3,636,519 | 1/1972 | Heath | 364/900 |
| 4,101,968 | 7/1978 | Florence | 364/900 |
| 4,110,837 | 8/1978 | Chen | 364/900 |
| 4,209,845 | 6/1980 | Berger et al. | 364/900 |

Primary Examiner—Leo H. Boudreau
Attorney, Agent, or Firm—G. J. Woloson; W. J. Benman, Jr.; A. W. Karambelas

[57] ABSTRACT

A hardware logic network, operating at real-time data rates, generates a signal which matches the Mth-largest signal of an input data set. To accomplish this signal-matching, the network utilizes an iterative series of value adjustments which cause an intermediate working quantity to converge to a number whose rank in comparison to the input set is the same as that of the true Mth-largest. When test comparisons indicate that the intermediate value's relative rank is too low, the value-adjustment is upward. The adjustment is downward otherwise. Operating upon input data whose range of possible values is limited to a predetermined interval, the system takes as its initial working quantity the midpoint of this interval. The magnitude of the first adjustment is one-half of the remaining interval on either side of the initial approximation. Subsequent magnitude adjustments are in turn one-half of the preceeding half-remaining-interval magnitude.

When the number R of inputs is odd and M is set equal to (R+1)/2, the network becomes a real-time median filter.

13 Claims, 1 Drawing Figure

REAL-TIME ORDINAL-VALUE FILTER UTILIZING HALF-INTERVAL RANKING

CROSS-REFERENCE TO RELATED APPLICATIONS

Here incorporated by reference are the disclosures of the following related, copending, common-assignee U.S. patent applications: Ser. No. 575,107, filed Jan. 30, 1984, titled "Real-Time Ordinal-Value Filter Utilizing Reference-Function Comparison", which is a continuation-in-part of Ser. No. 306,256, filed Sept. 28, 1981, now abandoned; Ser. No. 306,251, filed Sept. 28, 1981, titled "Real-Time Ordinal-Value Filters Utilizing Complete Intra-Data Comparisons", now U.S. Pat. No. 4,441,165; and Ser. No. 306,253, filed Sept. 28, 1981, Titled "Real-Time Ordinal-Value Filters Utilizing Partial Intra-Data Comparisons", now U.S. Pat. No. 4,439,840.

BACKGROUND OF THE INVENTION

1. Field of the Invention

The invention relates in general to signal-processing apparatus and in particular to networks for determining the Mth-largest value of an input data set. The invention has special relevance in those environments, such as image processing, where it is advantageous to perform this value determination in real time.

2. Description of the Prior Art

Presented here is the concept of an ordinal-value filter. This type of filter determines which one of a set of R applied data values is the Mth-largest. When R is odd and M is made equal to $((R+1)/2)$, the Mth-largest becomes the "middle" value of the data set, having in general an equal number of other data values both larger than and smaller than itself. Such a middle value is designated the median. A median filter is one which determines or selects this median value from an input data set.

Although both the basic concept of the median filter and its use in the field of image processing are well known, many prior realizations have depended upon time-consuming software routines.

Prior-art network concepts capable of being mechanized as hardware-economical, ordinal-value filters which perform the required determinations at the incoming data rate are presented by D. E. Knuth in Volume 3 of his book *The Art Of Computer Programming: Sorting and Searching* (1973). See especially the odd-even transposition sorting networks given in Knuth's FIG. 58 on page 241.

It should be noted, however, that the inventions claimed in this specification are considered to be patentably different from Knuth's concepts, as well as from the network concepts and mechanizations presented in the incorporated applications.

A real-time ordinal-value-filtering capability is extremely useful, especially, for example, in those situations where the ordinal-value processing of dynamic images is of greatest value when it can be performed as the images are occurring.

SUMMARY OF THE INVENTION

It is an aim of this invention, therefore, to provide apparatus for determining the Mth-largest value of a set of input data values.

It is also an aim of this invention to provide apparatus for performing such determinations with a minimum amount of hardware.

It is another aim of this invention to provide minimum-hardware implementations which can perform such determinations efficiently in real time.

These and other aims are achieved by the disclosed invention which in one of its aspects performs an iterative series of value adjustments so as to cause an intermediate working quantity to converge to a signal value whose rank in comparison to the input set is the same as that of the Mth-largest input. When test comparisons indicate that the intermediate value's relative rank is too low, the value-adjustment is upward. The adjustment is downward otherwise. Operating upon input data whose range of possible values is limited to a predetermined interval, the system takes as its initial working quantity the midpoint of this interval. The magnitude of the first adjustment is one-half of the remaining interval on either side of the initial approximation. Subsequent magnitude adjustments are in turn one-half of the preceeding half-remaining-interval magnitude. In another of the invention's aspects, the apparatus becomes a median filter when the number R of applied data values is odd and M is made equal to $((R+1)/2)$.

BRIEF DESCRIPTION OF THE DRAWING

These and other aims and advantages will become apparent from a study of the following specification when considered in conjunction with the accompanying drawing in which.

DETAILED DESCRIPTION OF THE INVENTION

I. Introduction

A. Overview

Figure 1:
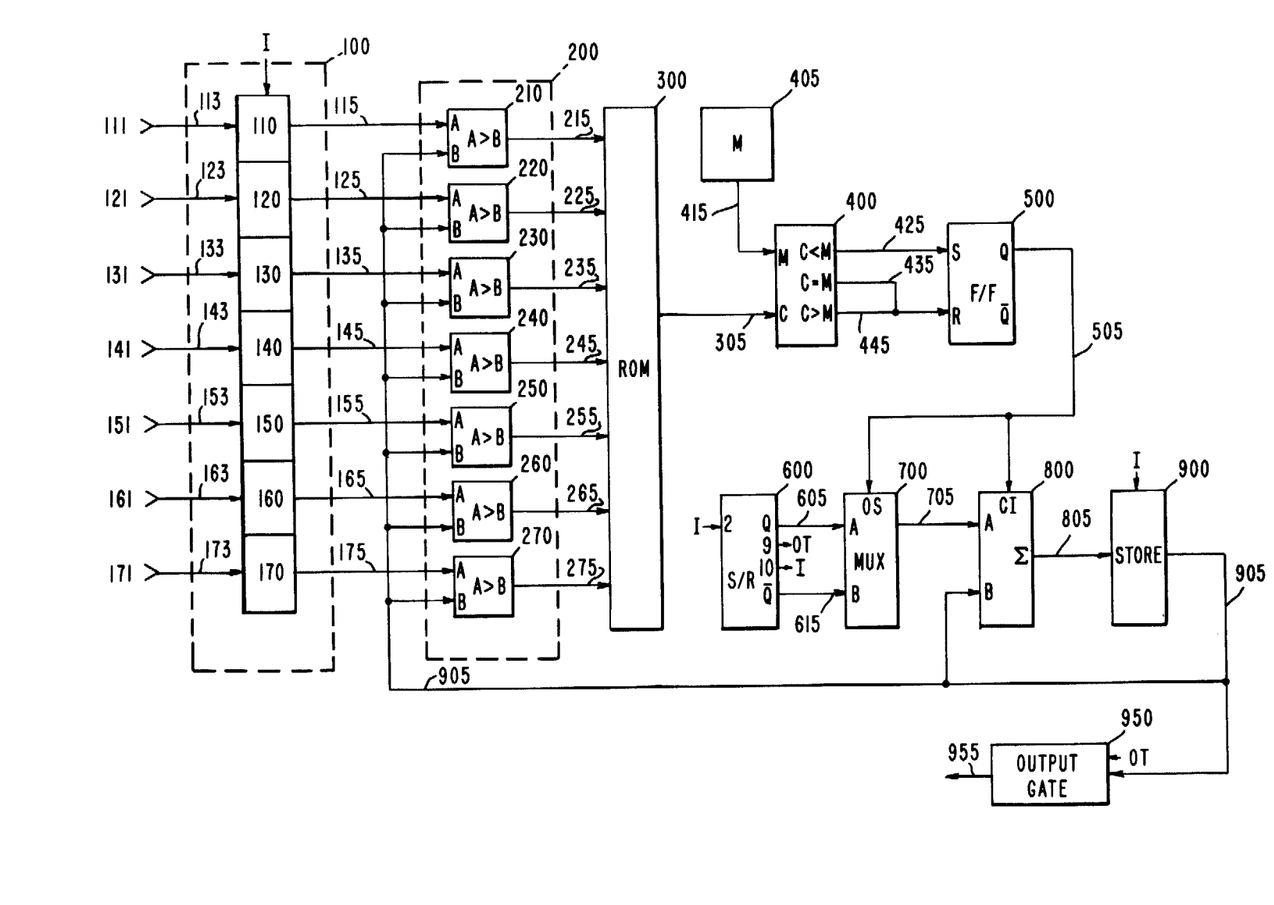
The FIGURE shows a preferred embodiment of the relative-ranking, value-adjustment, Mth-largest-generation network.

Included within the general scope of the claimed invention is the figure-depicted illustrative embodiment in which a signal stored in register 900 is successively adjusted until it equals or closely approximates the Mth-largest of a set of input data signals held in register 100. The register-900 signal is initialized at the ½ or midpoint value of the total range of values which the input signals might attain. A relative-ranking subnetwork, composed of comparators 200, read-only memory (ROM) 300, and comparator 400, determines whether M or more of the input signals are larger than the register-900 value. If so, the stored value is as yet too small to be the desired Mth-largest and is increased. The value is decreased otherwise. A half-interval, value-adjustment subnetwork, utilizing shift register 600, multiplexer 700, and adder 800, increases or decreases the register-900 quantity in accordance with the outcome of the relative-ranking determination. The magnitude of the adjustment is derived, in the illustrative embodiment shown, from shift register 600 which generates a succession of decreasing signal levels, each level of which is one half the magnitude of the previous level added or subtracted. The magnitude of the initial adjustment is one quarter of the total possible input-signal interval. Shift register 600 generates the level-adjustment sequence by shifting a one through its register positions, each of which represents the N orders of magnitude in an N-bit binary number. The logically-true value of this register-position number is used for increases, while the logical complement, together with a plus 1 carry-in from state transition flip flop 500, is used for intermediate value decreases through an implementation of one's complement subtraction. The relative-ranking, decreasing-half-interval, magnitude-adjustment sequence causes the register-900 value to converge to the true Mth-largest value of the input data signals.

B. Generic Concepts

The detailed description will focus on a particular mechanization which has been specially-adapted to determine the Mth-largest of an odd set of digital data signals whose values are represented as 8-digit, base-2, binary numbers. It is readily apparent, however, that this is merely a specific application of a generic inventive concept which encompasses not only the more general case of even sets of N-digit numbers in numerical systems of base B, but also for example analog processing of both odd and even sets of both analog and digital data signals, as well as digital, analog, and optical processing of sets of optical signal levels. These more general cases will be further discussed below.

C. Component Specifics

To the extent that it is necessary to direct attention toward the figure-depicted illustrative specific mechanization, it is also readily apparent that all of the individual components required to implement this mechanization are either well-known in the art or can themselves be realized through straightforward logic-design techniques. For example, the manner in which a read-only memory (ROM) would be configured as the below-described comparison counter 300 is considered to be not only well within the general skill of the art, but also especially apparent in view of the discussion, presented in the above-incorporated "Complete-Comparison" filter application, concerning the analogous manner in which such ROM's would be utilized as the rank-detection devices of that application. The detailed description will thus not dwell on the specifics of the internal workings of the block-diagram-type devices utilized.

II. Implementation Details

A. Input Register

Input register 100 receives a set of R subject data signals. Because these signals are used as references for a subsequent sequence of level-construction comparisons, register 100 holds them unchanged for the duration of the iterative operation of the remainder of the apparatus.

The illustrative embodiment has provisions for processing a set of up to seven signals with the individual elements of the signal set being held in subregisters 110 through 170. By biasing off an appropriate number of these subregisters, signal sets of different sizes can also be accommodated without impairing the effectiveness of the present embodiment's signal-construction operation.

In the example mechanization, the data signals are received at connections 111 through 171 from external sources not shown. As one of many alternatives still encompassed within the inventive concept, subregisters 110 through 170 could themselves be direct-sensing storage elements such as charge-coupled devices, thus eliminating the need for external source connections. Nevertheless, when in fact derived from external sources in accordance with the depicted example mechanization, the signals are presented in the previously-noted 8-bit binary format, and are carried by the respective 8-line data buses 113 through 173. The signals are then received and retained by the respective subregisters as 8-bit binary numbers.

In another alternative still encompassed within the inventive concept, input register 100 could be a shift register having successive subregisters 110 through 170. Such a register would receive over 8-line data bus 113 from connection 111 the individual elements of a serially-presented data stream. By means of either conventional timing and control techniques or an initialization signal to be described below, these individual data signals would be made to shift through the successive subregisters as subsequent data-stream elements were received.

In this shift-register configuration, the subject data sets whose Mth-largest value is to be formulated would be the successive R-unit clusters of data-stream elements as contained in the input register.

B. Intermediate Value Storage Register

Intermediate value storage register 900 holds the intermediate results of the signal-construction operation. Its contents represent the network's next guess as to that signal level which is the Mth-largest of the input data signals in register 100.

As a first guess or test value at the start of the level-construction process, the register is initialized at a signal level equal to the one-half or midpoint level of the entire magnitude range that any one of the input data signals might assume. In the case of signals presented as N-digit, positive values in a number system of base B, the initial half magnitude will be $(B^N)/2$. As implemented in the depicted base-2 8-bit binary realization, this initial value becomes $2^{(N-1)}$ or $2^7 = 128$. The initial value in register 900 is later modified in accordance with rank-testing and level-adjustment procedures to be described below.

The adjusted value which remains in register 900 at the completion of the subsequent procedures becomes the network's final estimate of the Mth-largest data signal. By activating output gate 950 only when the apparatus has completed its iterative operation, only the final estimate is allowed to exit from the overall network.

As implemented, register 900 and gate 950 are adapted to accommodate 8-bit binary signals which are transmitted over 8-line data buses 905 and 955. As additional aspects of the depicted implementation, the origin and nature of an output transfer signal "OT" and of an initilization signal "I" will likewise be described below.

C. Relative-Ranking Subnetwork

In one of its fundamental aspects, the inventive network is directed toward constructing in output register 900 a signal level which matches that input data signal whose own value makes it the Mth-largest among all input data signals. The target Mth-largest data value, however, is not initially known, because there is no advance indication as to which of the input signals is the true Mth-largest. The generation of such an indication is, of course, a main purpose of the overall apparatus. Nevertheless, while the target *value* is not known, the target *rank* is. The network, therefore, does not attempt to achieve its *value*-matching objective directly, but utilizes instead an indirect *rank*-matching technique in which the register-900 signal level is successively adjusted until its rank matches the known rank of the unknown data signal of interest.

Central to the mechanization of the rank-matching technique is the relative-ranking subnetwork. This subnetwork determines whether M or more of the input data signals are greater than the intermediate value. If M or more are in fact greater, then the intermediate value is too small to be the Mth-largest, and the subnetwork generates a value-adjustment signal which directs that the intermediate value be increased. A "decrease" directive is generated otherwise.

It will be apparent that among the substantially equivalent mechanizations would be an analogous relative-ranking configuraton in which the determination was conversely of whether the intermediate value was greater than M or more of the data values. Subsequent portions of the apparatus would then be appropriately adjusted to accommodate this converse determination.

In the subnetwork as mechanized, the overall relative-ranking determination is realized in two stages. First there is performed a comparison count in which a determination is made as to the number of input data signals which are larger than the current intermediate value. The resulting number is then compared to the relative-ranking indicator M.

The comparison count determination is itself performed in the two steps of first individually comparing the current intermediate value to each of the input data values, and then combining the results of these individual comparisons to produce an output-count signal indicative of the desired comparison count. As implemented in the illustrative embodiment, comparators 210 through 270 perform the individual comparisons between the data received on 8-line data buses 115 through 175 and the intermediate value received over 8-line data bus 905. The resulting individual comparison signals, each of which can be set to logic 1 to indicate that the respective input data value is larger than the intermediate value, are transmitted over single-bit output lines 215 through 275 to comparison counter 300. Implemented as a read-only memory (ROM), this counter generates the output-count signal which indicates the total number of input data values which are larger than the tested intermediate value. In the case where the network is made to accommodate 7 input signals, the output bus 305 which carries the output-count signal contains 3 lines so as to make possible an indication of the 3 bit binary representation required for the maximum number 7.

The rank comparison is performed in the illustrative embodiment by comparator 400. This comparator receives over bus 305 the result of the individual comparisons between the data and the current intermediate value, while receiving over bus 415 from selectable rank generator 405 a rank-count signal equal to the desired ranking quantity M. In operation, relative-ranking comparator 400 sets output line 425 to logic 1 when less than M of the input data signals are greater than the intermediate value. The comparator sets line 435 to logic 1 when the number of input values greater than the current intermediate value is the same as the desired ranking quantity M. Output line 445 is set to logic 1 when the number of input data values greater than the current intermediate value is greater than the desired ranking quantity M. The depicted connection of output line 435 to output line 445 causes comparator 400 to implement the previously-presented decision criterion of directing a subsequent addition to the tested intermediate value when M or more of the input data signals are greater than this value.

As an alternative, a slightly different decision criterion could be implemented by connecting "equal" line 435 to line 425, while adjusting selectable rank generator 405 to produce a rank-count signal M' equal to a ranking quantity of (M−1). The use of this alternative criterion would produce no change in the overall system's output.

The logic levels carried by lines 425 and 445 together comprise a relative-rank signal which in the illustrative embodiment is fed to state-transition flip flop 500. Line 425 feeds the device's Set input, while line 445 feeds the Reset input. The logically-true Q output has two output states: an affirmative, logical one state and a neutral, logical zero state. Output line 505 carries these logic levels as a value-adjustment signal. In the depicted mechanization, this signal is logical one when less than M of the input data signals are greater than the current intermediate value. The value-adjustment signal is zero when M or more of the input data signals are greater than the current intermediate value. It will be seen below that when the logic level is one, the current intermediate value is decreased, while when it is zero, the value is increased.

D. Half-Interval Value-Adjustment Subnetwork

The value-adjustment subnetwork generates the quantity by which the current intermediate value is to be altered and then performs the alteration by adding or subtracting this quantity to or from the intermediate value. The overall filter is designed to perform the relative-ranking and value-adjustment sequence iteratively with a selectable number $(N-1)$ of iterations. The magnitude of the increase or decrease depends upon the particular iteration being processed. In general, the alterations are made in accordance with a "half-interval" scheme which operates in the following manner: The system begins its first iteration with an intermediate value set to the one-half or midpoint value of the range T of total possible values for the input data. The magnitude of the first change is one-half of the remaining half interval on either side of this initial quantity or one-quarter of the total possible range. Thereafter, the magnitude is the same as that fraction of the entire interval equal to $(\frac{1}{2})$ raised to that power which is one greater than the iteration number. Thus, at the second iteration the $(\frac{1}{2})$ power would be 3, and the resulting change magnitude would be $(\frac{1}{8})$th of the entire interval. The final half-interval value-adjustment will add or subtract that magnitude equal to the $((\frac{1}{2})^N)$th fraction of the entire interval T.

Although the system's operation will be examined in greater detail in the examples given below, two processing situations of interest will be dealt with here to clarify the manner in which this particular subnetwork functions. In the first case, the possible range of values covers the positive numbers between zero and some maximum value T. Here the initial intermediate value would be set to the midpoint of this interval or (T/2), and the magnitude of the first value-adjustment would be $(\frac{1}{4})$ of T or (T/4). In a second situation, the range of possible signal values could extend from $-(T/2)$ to $+(T/2)$. While the magnitude of the first half-interval value-adjustment would still be (T/4), the initial-value midpoint of this interval would be the value zero.

In the case of positive, N-bit digital data, the total possible range T covers the $2^N$ positive numbers from zero through $((2^N)-1)$. This system will be initialized at the (T/2) value of $2^{(N-1)}$, while the first half-interval value-adjustment will be the (T/4) value of $2^{(N-2)}$. Subsequent half-interval magnitudes can be expressed as (2) raised to a decreasing sequence of the remaining nonzero powers (N−3) through 1. For the implemented case of 8-bit digital data, the total interval is thus the $2^8$ values from zero through ($2^8$-1), with the initial intermediate value being $2^7$, and with $2^6$ used as the initial half-interval value-adjustment.

Shift register 600 performs the magnitude selections in the depicted embodiment. The contents of its register positions become the coefficients of the various orders of magnitude in the magnitude-adjustment quantity, with the first and successive positions respectively corresponding to the highest and successively-smaller orders of magnitude. This register is thus chosen to have a number of register positions at least equal to the number of bits in the data being used, which in this mechanization is 8. (It will be demonstrated later that the system can be made to operate with one less register position than the number of bits in the data.) As is typical with conventional shift registers, register 600 has two sets of outputs: a set of 8, logically-true outputs which passes the logically-true contents of the shift register positions, and a set of 8 complement ouputs which passes the logical complements of the contents of the shift register positions. As described below, the complement outputs, together with a carry-in bit also described below, are used by the example apparatus as "negative" values for subtractive value-modifications.

In accordance with the initialization rules given above, the register is initialized with zeros in all register postions except for a single 1 which is placed in the second register position. In subsequent iterations the 1 is shifted through the remaining register positions. The composite output of the register as thus initialized becomes the binary representation of the required half-interval magnitude, decreasing powers of two.

The final half-interval magnitude is a measure of the accuracy of the number-construction process because it gives the maximum deviation possible between the true Mth-largest data input value and the final output value of the overall apparatus. The degree of accuracy can be made as small as is desired, subject to the condition that the value-adjustment subnetwork be configured to generate signals of the requisite change magnitude. In a typical system operating on N-bit digital data, with a number of iterations set to one less than the number of bits or (N−1), the resulting estimate of the true Mth−largest value is accurate to within the magnitude of the data's least significant bit. This will also be seen in greater detail in the illustrative examples presented below.

The addition and subtraction functions of the value-adjustment subnetwork are performed in the example mechanization by multiplexer 700 and adder 800. Multiplexer 700 receives over lines 605 the positive value of the value-adjustment magnitude, and receives over lines 615 the value's "negative" complement. An output-select command described below causes one or the other of these values to be passed on to adder 800 over lines 705.

Adder 800 combines the received magnitude signal with the current intermediate value sent from register 900 over lines 905. The result of the addition operation is passed over lines 805 to output register 900 where it becomes the next intermediate value used in the relative-ranking and value-adjustment process.

One's-complement-type subtraction is utilized in the depicted binary digital number case when the value-adjustment signal indicates that the current intermediate value must be decreased. In accordance with this method of subtraction, the logical complement of the register-600 magnitude is added to the current register-900 value, and the least significant bit of the sum is increased by the value one. When the value-adjustment signal indicates that the current intermediate value must be increased, the logically-true version of the register-600 magnitude is added to the current register-900 value, while the sum's least significant bit is left unchanged.

The appropriate quantities are selected and combined in the following way: The value-adjustment signal carried over line 505 is received at the adder's carry-in input "CI" and at the multiplexer's output-select input "OS." The carry-in connection causes the logic level on line 505 to be added to the least significant bit of the adder's (A+B) sum. The output-select connection causes the multiplexer's B input to pass onto output lines 705 when the line 505 logic level is 1, while causing the A input to pass otherwise. As a result, when the value-adjustment signal is in its neutral output state of logic zero, thereby indicating that the current intermediate value must be increased, the logically-true outputs of shift register 600 are passed to adder 800, and the resulting sum is left unchanged when a logic zero is added to its least significant bit. In the situation where the relative-ranking indicates that the current intermediate value must be decreased, the value-adjustment signal takes on its affirmative output state of logic level 1, which in turn causes both the complement outputs of register 600 to be passed to adder 800 and a logic 1 to be added to the least significant bit of the sum. The described multiplexer-select and carry-in connections thus automatically enable the value-adjustment signal to direct either an increase or decrease in the stored intermediate value.

As refinements in the example mechanization, shift register 600 has been provided with two register positions in addition to those strictly required for generating magnitudes of the desired degree of accuracy. Both positions are initialized at zero along with the other register positions as described above. The output from the first additional position is used as an output-transfer signal "OT" which activates output gate 950 upon the completion of the iterative operation of the overall apparatus. This first position performs the output transfer when it receives the single logic 1 which has shifted through all other register positions during the system's previous iterations. Following the output transfer, the single logic 1 is shifted to the second additional register position where when outputted provides an initialization signal "I" for the overall apparatus. This initialization signal is transmitted to input register 100, to the second register position of shift register 600 itself, and to register 900.

When mechanized to receive the subject data signals in parallel, input register 100 is configured so that the initialization signal causes existing data signals to be cleared, thereby preparing the overall system for the reception and processing of an entirely new subject data set. When mechanized as a shift register to sequentially receive the individual elements of a serially-presented data stream, the register is configured so that the initialization signal causes existing data signals to shift to the next subsequent subregister positions. Subregister 110 is thereby cleared for the reception of the next-presented data signal, while the overall system is thereby prepared for the processing of a new subject data set having just one element different from the previous set.

The initialization signal's setting of a one in the second-most-significant bit position of magnitude-generation shift register 600 establishes the initial value-adjustment magnitude of (¼) of the total signal-value interval for the positive-value binary-data case.

Register 900 is configured so that the receipt of the initialization signal causes the existing contents to be cleared, and a logic 1 to be set into the most-significant register position. For the binary data case, this produces a new, interval-midpoint, initial intermediate value.

It will be apparent to those skilled in the art that because the initialization signal from the second additional position is not generated until after the filter has started to function, an actual operational system would still require a "first" initialization when the very first data set is applied to the apparatus. A first initialization of this type could readily be provided by conventional control means and techniques, both well-known in the art.

In the illustrative embodiment it will also be readily apparent that the most-significant-bit position of shift register 600 is always zero. As a further minor refinement, therefore, it is possible to reduce the size of the shift register by one and compensate for the elimination by biasing the most significant logical-true input of the multiplexer to logic zero, while biasing the most significant logical-complement input to logic one.

E. Operational Advantages

When the number R of inputs is odd and the relative-ranking indicator is set equal to the quantity $(R+1)/2$, the described network becomes a median filter which selects from the input data set that data value which has an equal number of other data values both greater than and less than itself. A special advantage of such a median filter implemented as described in the figure-depicted example mechanization is its ability to construct the median value at real-time data rates. This is an exceptionally valuable feature in the above-referred-to operational environment of image processing.

III. Operational Examples

Four operational examples will be discussed in the context of a digital mechanization where it is desired to construct a three-bit replica of the median of an input set of five data values. Three digital-data situations and one analog-data case will be examined. The three digital-data situations will be first, where the median is a general odd number; second, where it is a general even number; and then third, where it is that particular even number which is the midpoint of the range of possible values.

The four cases are set out in Tables 1 through 4. At the top of each table are listed the case number, the target rank M, and the initially-unknown Mth-largest target value in both binary and base-ten representation.

Each of these tables first shows the five input data values to be operated upon in the given case. For the sake of clarity, the inputs have been arranged in ascending numerical order even though in a typical operational environment the data values would be presented unordered.

To provide an insight into the internal functioning of the overall apparatus during normal operation, the second part of each table presents the values taken on by various signals and registers as the number-construction is performed. In this part of the table, the first column is the iteration number i, while the second shows the contents of register 900 which in each iteration is the current intermediate value. The third column presents the read-only-memory output which at each iteration indicates the number of input data values that are greater than the currently-held register-900 value. The fourth column represents the addition or subtraction directive as given by the value-adjustment signal appearing on line 505. The contents of shift register 600 are shown in the fifth column, while the true or complement shift register output selected for transmission through the multiplexer is shown in the sixth column. The seventh column gives the transitional addition result at adder 800, while the register-900 contents of a subsequent iteration line show the change if any due to a one's-complement carry-in. In accordance with rules previously stated, for a three-bit binary number there will be two iterations. The register-900 quantity listed for iteration three is actually the final output of the overall number-construction process.

The final section of each table contains a representation of the subject total-interval scale. Given the use of three-bit binary numbers for the number-construction process, the resulting scale covers the eight positive numbers from zero to 7. The binary and the corresponding base-ten representations of these eight numbers have been listed.

As noted above, the cases will be analyzed in terms of finding the median signal among five input signals. The ranking quantity M thus becomes the integer 3. The value in the zero-to-seven scale which is the third largest of the input set has been identified by the bracketed Mth ranking-pointer next to each scale.

The last part of each table also shows by a series of points and directional arrows the sequence of values assumed by the current intermediate value in register 900 as the number-construction process proceeds. In accordance with the above-stated half-interval initialization rules, it can be seen in these situations that the starting intermediate value becomes the number 4.

TABLE 1

| Case 1: M = 3, Mth-largest = 001(1) | | | | | | | |
|---|---|---|---|---|---|---|---|
| (a) | Ordered Inputs: | | | | | | |
| | [111] (7) | | | | | | |
| | [010] (2) | | | | | | |
| | [001] (1) | | | | | | |
| | [001] (1) | | | | | | |
| | [000] (0) | | | | | | |
| (b) | Internal-Signal Sequence | | | | | | |
| | [i] | Register 900 | ROM=[#>] | VA | SR | Mux | Σ |
| | 1 | 100 (4) | 1 | — | 010 | 101 | 001 |
| | 2 | 010 (2) | 1 | — | 001 | 110 | 000 |
| (Output) | 3 | 001 (1) | | | | | |
| (c) | Intermediate-Value Sequence | | | | | | |
| | | (111) 7 | | | | | |
| | | (110) 6 | | | | | |
| | | (101) 5 | | | | | |
| | | (100) 4 | | | | | |
| | | (011) 3 | | | | | |
| | | (010) 2 | | | | | |
| | [Mth] → (001) 1 | | | | | | |
| | | (000) 0 | | | | | |

The five inputs listed here in (a) would be loaded into input register 100 while register 900 is being initialized at binary 100 (decimal 4) as shown in column 2 of (b) for iteration 1. The register-900 number is carried along bus 905 to individual comparators 200 where one of the input values will be found to be larger than the current intermediate value. The output signals from the comparators will be totaled by ROM 300 which then generates an output quantity of 1 as shown in column 3. With the selectable rank generator producing a rank count signal of 3, comparator 400 will produce an indication that the rank count signal on line 415 is greater than the comparison count output signal on line 305 and thus activate output line 425. This will in turn set state-transition flip flop 500 causing the signal on output line 505 to become a logic one. As the value-adjustment signal, this logic one indicates that the first, half-interval, value modification will be a subtraction as shown in column 4 of the table. Shift register 600, initialized with its second most significant bit position equal to 1, will produce the output binary 010 (decimal 2) as shown in column 5. This is the required one-quarter-interval adjustment magnitude. The logic level one on line 505 will cause the complement output of the shift register to be passed through multiplexer 700. The column-6 signal 101 is then transmitted over line 705 to the adder. A combination of binary 100 from register 900 with binary 101 from the multiplexer produces the column-7 binary sum of 001. Upon being complemented by the logic one carry-in from line 505, the sum becomes the new column-1, iteration-2 intermediate value of binary 010 (decimal 2) in register 900. At iteration 2 the process then repeats with the result of the comparison between this intermediate value and all of the input data signals producing a read-only-memory output of 1 indicating that still only one of the input signals is greater than the current intermediate value. Because this is less than the rank count signal, the value-adjustment line will again be set to logic one causing another subtraction of the adjustment magnitude from the current intermediate value. Shift register 600 will have now shifted the single logic 1 to its least significant shift register position. The complement of this quantity is passed by multiplexer 700 to adder 800 with the sum of the binary 110 from the multiplexer and the binary 010 from register 900 producing a new sum of binary 000. After being complemented, the sum 001 (decimal 1) is the system's final output which in this case is identical to the true median value. The line graph in Part (c) of Table 1 shows the transitions from a starting initial value of 4, through a transition value of 2, to a final value of 1.

The next two cases demonstrate the effects caused by some minor "limitations" of the present filter: First, even though the system's dominant tendency, as a result of the iterative, decreasing-magnitude, value-adjustment sequence, is to cause the intermediate value to converge toward the true Mth-largest value, there are situations where the system's ordinary functioning causes the value being constructed to *diverge* from instead of *converge* toward the true Mth-largest. This occurs principally in those cases where, during an iteration *prior to* the predetermined completion point of the number-construction operation, the intermediate value becomes either equal to the target value or closer to it in magnitude than the minimum accuracy achievable by the system. In such cases, divergence errors are introduced by the limited-alternative, mandatory nature of the value-adjustment steps which follow the given relative-ranking determination. This is an inherent limitation in a device which, lacking the above-mentioned advance indication as to the true target value, does not provide a "premature-stop/no-change" alternative. Although inherent, however, the limitation's effect is in the end minimal because the system's convergence tendencies dominate to the extent of always bringing the final constructed value to within the preselected minimum accuracy of the apparatus.

As a corrolary to this first limitation, the cases also demonstrate secondarily that where the median value is an even number, then a binary, digitally-implemented network will produce a discrepancy of value 1, which is the same as the magnitude of the data's least significant bit.

TABLE 2

| Case 2: M = 3, Mth-Largest = 110(6) | | | | | | |
|---|---|---|---|---|---|---|
| (a) | Ordered Inputs: | | | | | |
| | [111] (7) | | | | | |
| | [111] (7) | | | | | |
| | [110] (6) | | | | | |
| | [011] (3) | | | | | |
| | [010] (2) | | | | | |
| (b) | Internal-Signal Sequence | | | | | |
| | [i] Register 900 | ROM=[#>] | VA | SR | Mux | Σ |
| | 1  100 (4) | 3 | + | 010 | 010 | 110 |
| | 2  110 (6) | 2 | − | 001 | 110 | 100 |
| (Output) | 3  101 (5) | | | | | |
| (c) | Intermediate-Value Sequence | | | | | |
| | (111) 7 | | | | | |
| | [Mth] → (110) 6 | | | | | |
| | (101) 5 | | | | | |
| | (100) 4 | | | | | |
| | (011) 3 | | | | | |
| | (010) 2 | | | | | |
| | (001) 1 | | | | | |
| | (000) 0 | | | | | |

The designated input set is presented at input register 100, while register 900 is initialized at binary 100 and register 600 is initialized at binary 010. A comparison between the intermediate value and the inputs shows that 3 inputs are greater than the intermediate value. This condition causes an "addition" value-adjustment command to be generated. Adding the contents of shift register 600 to that of register 900 produces binary sum 110 which becomes the starting point for the next iteration. Only two of the input values are now larger than this new intermediate value. Under the depicted primary decision criterion, a subtraction is performed resulting in a final intermediate value of binary 101 (decimal 5).

With an intermediate value that progresses from a starting value of 4, through the true median value of 6, to a final output value of 5, this case thus shows a situation where the true median value is reached prior to the end of the iterative process. As discussed previously, even though the system continues its iterations, the final output is not significantly different from the true median. In a typical operational situation where 8-bit binary data is utilized, the impact of a least-significant-bit discrepancy is minimal.

TABLE 3

| Case 3: M = 3, Mth-Largest = 100(4) | | | | | | |
|---|---|---|---|---|---|---|
| (a) | Ordered Inputs: | | | | | |
| | [110] (6) | | | | | |
| | [101] (5) | | | | | |
| | [100] (4) | | | | | |
| | [010] (2) | | | | | |
| | [000] (0) | | | | | |
| (b) | Internal-Signal Sequence | | | | | |
| | [i] Register | ROM=[#>] | VA | SR | Mux | Σ |

TABLE 3-continued

Case 3: M = 3, Mth-Largest = 100(4)

|  |  | 900 |  |  |  |  |  |
|---|---|---|---|---|---|---|---|
|  | 1 | 100 (4) | 2 | — | 010 | 101 | 001 |
|  | 2 | 010 (2) | 3 | + | 001 | 001 | 011 |
| (Output) | 3 | 011 (3) |  |  |  |  |  |
| (c) | Intermediate-Value Sequence |  |  |  |  |  |  |
|  |  | (111) 7 |  |  |  |  |  |
|  |  | (110) 6 |  |  |  |  |  |
|  |  | (101) 5 |  |  |  |  |  |
| [Mth] → | (100) 4 |  |  |  |  |  |  |
|  |  | (011) 3 |  |  |  |  |  |
|  |  | (010) 2 |  |  |  |  |  |
|  |  | (001) 1 |  |  |  |  |  |
|  |  | (000) 0 |  |  |  |  |  |

With this particular set of inputs, the initial register-900 value is in fact the true median. Even though the initial value-adjustment produces a divergence from the true value 4 down to intermediate value 2, the system minimizes the effect of this divergence by returning to the value 3 which again is within the binary-operation, least-significant-bit accuracy of the overall filter.

TABLE 4

Case 4: M = 3, Mth-Largest = 0.4

| (a) | Ordered Inputs: |
|---|---|
|  | [6.3] |
|  | [2.1] |
|  | [0.4] |
|  | [0.3] |
|  | [0.0] |

(b) Internal-Signal Sequence

| [i] | Register | ROM=[#>] | VA | SR | Mux | Σ |
|---|---|---|---|---|---|---|
|  | 900 |  |  |  |  |  |
| 1 | 100 (4) | 1 | — | 010 | 101 | 001 |
| 2 | 010 (2) | 2 | — | 001 | 110 | 000 |
| (Output) 3 | 001 (1) |  |  |  |  |  |

(c) Intermediate-Value Sequence (111) 7
(110) 6
(101) 5
(100) 4
(011) 3
(010) 2
[Mth = 0.4] → (001) 1
(000) 0

This case demonstrates that even with analog input signals the system is capable of generating a median value whose net discrepancy from the true median is within the previously-specified minimum accuracy.

IV. Equal-Data Ambiguities

Included within the information incorporated at the beginning of this specification is a discussion, presented in the document entitled "Real-Time Ordinal-Value Filters Utilizing Complete Intra-Data Comparisons," concerning equal-data ambiguities. As explained more fully in that document, the presence of equal data values among the members of a given R-unit data set is considered to give rise to an ambiguity in that the equality creates a discrepancy between the number of *magnitudes* and the number of *signals* which the data set contains.

From the standpoint of terminology, such ambiguities are resolved by means of a special definition. In accordance with this definition, expressions such as "Mth-largest" (in the sense of the Mth-largest *magnitude*) are specially defined as being a designation for that data-set element which would occupy the Mth *position* in an ordered-by-magnitude listing of the set's data signals. Furthermore, it may be observed that, from the standpoint of device operation, such ambiguities present no significant difficulties for the invention of the present specification.

The preceding description has presented in detail merely an exemplary preferred embodiment of the claimed invention. It will be apparent to those skilled in the art that numerous other alternative embodiments encompassing many variations may readily by employed without departing from the spirit and scope of the invention as set forth in the appended claims, in which:

What is claimed is:

1. An apparatus for formulating a signal which approximates the Mth-largest of a set of R applied data signals, where the possible values of said applied signals can extend over a total interval T, and where, for a given set of R signals, said formulation is accomplished through a plurality of iterative operating cycles, with each cycle identified by an iteration count J, said apparatus comprising:

(A) Input storage means, for receiving and storing the subject set of R signals;

(B) Intermediate value storage means, for storing, as an intermediate signal value, the value taken on by said approximating signal during each of said plurality of operating cycles as the signal is being formulated, where at the start of the cyclic operation the intermediate value is initialized at the midpoint value of said total interval T;

(C) Relative ranking means, responsive to said R stored data signals and to said intermediate value, (1) for determining whether M or more of said R input data signals are larger than said intermediate value, or whether less than M are larger; and (2) for producing a value-adjustment signal indicative of the two possible outcomes of this determination; and (D) Half-interval value-adjustment means, responsive, during each of said iterative operating cycles J, to said value-adjustment signal and to said intermediate value, (1) for generating a magnitude-change value equal to that fraction of said total interval T which is the same as the Kth power of ($\frac{1}{2}$), where the value of K is one larger than said iteration count J;

(2) for increasing said intermediate value by adding said magnitude-change value to said intermediate value when said value-adjustment signal indicates that M or more of said R input signals are greater than said intermediate value; and (3) for decreasing said intermediate value by subtracting said magnitude-change value from said intermediate value when said value-adjustment signal indicates that less than M of said R input signals are greater than said intermediate value;

(4) for outputting the resulting increased or decreased intermediate value as a magnitude-changed intermediate value;

said intermediate value storage means being responsive to the output of said half-interval value-adjustment means and receiving said magnitude-changed intermediate value as a new intermediate value;

with the Jth operating cycle being completed upon said new-value receipt by said intermediate storage means, and with said apparatus then executing its next operating cycle which begins with said relative ranking means utilizing said new intermediate value to perform said determination and production;

whereby after the completion of a selectable number (N−1) of iterative operating cycles, the intermediate value remaining in said intermediate value storage means approximates the desired Mth-largest data signal with an accuracy of that fraction of said total interval T which is the same as the Nth power of ($\frac{1}{2}$).

2. Apparatus according to claim 1 in which said relative ranking means includes:
  (a) comparison counter means,
    (i) for determining how many of said R applied signals are greater than said intermediate value, and
    (ii) for generating an output count signal indicative of the results of this quantity determination; and
  (b) rank comparison means, responsive to said output count signal from said comparison counter means,
    (i) for comparing the ordinal indicator M with the quantity indicated by said count signal,
    (ii) for generating a relative-rank signal indicative of whether or not M is greater than said count quantity.

3. Apparatus according to claim 2 in which said comparison counter means includes:
  (i) individual comparison means,
    (a) for separately comparing said intermediate value to each of said R applied signals; and
    (b) for generating an individual comparison signal for each of these comparisons, each of said signals indicating whether or not that particular applied signal is greater than said intermediate value; and
  (ii) summation means, responsive to all of said individual comparison signals from all of said individual comparison means,
    (a) for computing the total number of those of said comparison signals which indicate that the respective applied signals are greater than said intermediate value; and
    (b) for generating said output count signal as an indicator of this total.

4. Apparatus according to claim 2 in which said rank comparison means includes:
  state transition means, responsive to said relative-rank signal, for generating said value-adjustment signal by establishing affirmative and neutral output states, said affirmative state indicating that M is larger than said count quantity and that said intermediate value is to be decreased, and said neutral state indicating that M is equal to or less than said count quantity and that said intermediate value is to be increased.

5. Apparatus according to claim 1 in which said half-interval value-adjustment means includes:
  (A) magnitude selection means, for generating said magnitude-change value equal to said total interval fraction; and
  (B) add/subtract means, responsive to said intermediate value, to said value-adjustment signal, and to said magnitude-change value, for performing said increasing or decreasing functions by respectively adding or subtracting said magnitude-change value to or from said intermediate value according to the selective command of said value-adjustment signal.

6. Apparatus according to claim 5 in which:
  (a) each of said R applied signals is a digital, binary number of N digits;
  (b) said entire interval T comprises the ($2^N$) numbers of zero through (($2^N$)−1)
  (c) said initial intermediate value is (($2^N$)/2) or ($2^{N-1}$); and
  (d) said magnitude selection means includes: shift register means
    (i) for producing a first output signal sequence, where the individual signals of said sequence are produced one per iterative operating cycle of the overall approximation apparatus, and where the signal generated at the Jth cycle equals ($2^N$)/($2^K$), and
    (ii) for producing, simultaneously with said first signal sequence, a second output signal sequence, where each signal in said second sequence is the N-digit negative of that signal being produced in said first output sequence.

7. Apparatus according to claim 6 in which said add-/subtract means includes:
  (i) multiplexer means, responsive to said value-adjustment signal and to both of said first and second output signal sequences,
    (a) for outputting said first sequence after those comparisons when said value-adjustment signal indicates that said intermediate value is to be increased; and
    (b) for outputting said second signal sequence after those comparisons when said value-adjustment signal indicates that said intermediate value is to be decreased; and
  (ii) addition means, responsive to the output of said multiplexer means and to said intermediate value, for adding said multiplexer output to said intermediate value, with the result of this addition becoming the output of the overall half-interval, value-adjustment means.

8. Apparatus according to claim 7 in which:
  (a) said shift register means includes: first through Nth shift register positions and 2N outputs,
    (i) the first N of said outputs:
      /a/ indicating the logically true contents of said first through Nth shift register positions;
      /b/ corresponding N digits of the binary number system being operated upon, with the most significant bit being the contents of the first shift register position;
      /c/ taken together at a given time, comprising the individual signals of said first output sequence;
    (ii) the second N of said outputs:
      /a/ indicating the logical complement of said N shift register positions;
      /b/ taken together at a given time, comprising the individual signals of said second output sequence;
    (iii) the individual signals of said first output sequence comprising all zeros except for a logic one in one shift register position, said logic one being:

/a/ initially set in the second shift-register position corresponding to the second-most-significant digit, and /b/ sequentially shifted (N−1) times through all successive shift register positions to form at each shift a unique one of the remaining signals of said first output sequence; and (b) said addition means includes: one's complement means for increasing the least significant digit of said addition result by the value 1 when said value-adjustment signal indicates that said intermediate value is to be decreased.

9. Apparatus according to claim 8 in which:
(a) said value-adjustment signal is a logical one when said intermediate value is to be decreased and is a logical zero when said intermediate value is to be increased;
(b) said multiplexer means includes:
  (i) output select means, responsive to the logic states of said value-adjustment signal,
    /a/ for selecting as output said first signal sequence when said logic state is zero; and
    /b/ for selecting as output said second signal sequence when said logic state is one; and
(c) said one's complement means includes: carry-in means, responsive to the logic states of said value-adjustment signal, for adding said logic signal, whatever its state, to the least significant bit of said addition result, thereby automatically performing the addition-result-increase function of said one's complement means in those cases where the intermediate value is to be decreased.

10. Apparatus according to claim 9 further including:
(1) output means, responsive to the contents of said intermediate value storage means, for receiving, storing, and outputting the final approximation signal that remains in said storage means after said (N−1) operating cycles; and also including
(2) in said shift register means:
  (a) an (N+1)st shift register position and corresponding output, said position being set to logic zero at the start of said approximation operation, and receiving said shifting, single logic one after the completion of said approximation operation,
  (b) said (N+1)st corresponding output
    (i) being connected to said output means, and
    (ii) forming an output-transfer signal which upon transition to logic one activates the outputting function of said output means.

11. Apparatus according to claim 10 in which said shift register means includes:
(a) an (N+2)nd shift register position and corresponding output, said position being set to logic zero at the start of said approximation operation, and receiving said shifting single logic one after the completion of said output-transferring function,
(b) said (N+2)nd corresponding output
  (i) being connected to said input storage means, to said intermediate value storage means, and to said shift register means; and
  (ii) forming an initialization signal which upon receipt by the respective means causes:
    /a/ new data to be applied to said input storage means,
    /b/ a logic one to be set into the second shift register position of said shift register means, and
    /c/ a logic one to be set into the most-significant-bit position of said approximation storage means;

whereby, when said single logic one shifts to said (N+2)nd register position, said apparatus is prepared to formulate a new Mth-largest value, with said input storage means containing a new subject set of R data signals, with said intermediate value storage means containing the initial approximation of $2^{(N-1)}$, and with said shift register means containing the initial value-adjustment magnitude of $2^{(N-2)}$.

12. Apparatus for formulating a number which approximates the Mth-largest of a set of R applied data numbers, where each of the R numbers has N digits in a number system of base B, and where the possible values of said applied data can extend over a total interval T, the interval T being zero through ($B^N$) when the input data takes on only positive values, while being $-(B^N)$ through $+(B^N)$ otherwise, and where, for a given set of R data numbers, the formulation is accomplished through a selectable number (N−1) of iterative operating cycles, with each cycle identified by an iteration count J, this apparatus comprising:

(A) input storage means, for receiving and storing the subject set of R applied numbers;

(B) intermediate value storage means, for storing, as an intermediate signal value, the value taken on by said approximating signal during each of said iterative operating cycles as the signal is being formulated, where at the start of the cyclic operation the intermediate value is initialized at the mid-point value of said total interval T;

(C) comparison counter means, responsive to said R stored numbers and to said intermediate value,
  (1) for determining how many of said R applied numbers are greater than said intermediate value, and
  (2) for generating an output count signal indicative of the results of this quantity determination;

(D) rank comparison means, responsive to said output count signal from said comparison counter means,
  (1) for comparing the ordinal indicator M with the quantity indicated by said count signal, and
  (2) for generating a relative-rank, value-adjustment signal indicating whether or not said count quantity is less than said number M;

(E) magnitude selection means, for generating a magnitude-change value equal to $(B^N)/(2^K)$ when the input data takes on only positive values, the magnitude signal being $(B^N)/(2^{(K-1)})$, otherwise, where in either case the value of K is one larger than said iteration count J; and (F) add/subtract means, responsive to said intermediate value, to said relative-rank value-adjustment signal, and to said magnitude-change value,
  (1) for adding said magnitude-change value to said intermediate value when said rank-adjustment signal indicates that said count quantity is not less than M;
  (2) for subtracting said magnitude-change value from said intermediate value when said rank-adjustment signal indicates that said count quantity is less than M;
  (3) for outputting the resulting sum or difference as a magnitude-changed intermediate value;

whereby when M or more of said R input numbers are greater than said intermediate value, said value is increased, while when less than M of said R input numbers are greater than said intermediate value, said value is decreased;

said intermediate value storage means being responsive to the output of said add/subtract means and receiving said magnitude-changed intermediate value as a new intermediate value;

with the Jth operating cycle being completed upon said new-value receipt by said intermediate storage means, and with said apparatus then executing its next operating cycle which begins with said comparison counter means utilizing said new intermediate value to perform said determination and generation;

whereby after the completion of the selectable number (N−1) of iterative operating cycles, the intermediate value remaining in said intermediate value storage means approximates the desired Mth-largest data value with an accuracy of that fraction of said total interval T which is the same as the Nth power of ($\frac{1}{2}$).

13. Apparatus for formulating a succession of N-bit binary numbers, each of which approximates the median value of one R-unit data set in a serially-generated succession of applied data numbers, where each of the data numbers is a positive, N-digit binary number, where R itself is an odd number, where for a given set of R data numbers, the formulation is accomplished through (N−1) iterative operating cycles, and where the apparatus operates at real-time data rates with the formulation of any one approximating number being completed prior to the occurrence and application of new data, this apparatus comprising:

(A) an R-position input shift register, having R storage positions for sequentially receiving and storing the individual data numbers of successive, R-unit data sets;

(B) an intermediate value storage register, having first through Nth storage positions and corresponding outputs, and storing, as an intermediate median value, the value taken on by said approximating number during each of said (N−1) iterative operating cycles as the median is being formulated, where the successive, most-significant through least-significant bits of said intermediate value are stored in the successive first through Nth storage positions, and where, at the start of the cyclic operation for any given data set, the intermediate value is initialized at $(2^N)/2$ or $2^{(N-1)}$;

(C) R individual comparators, each of said comparators
  (1) being responsive both to said intermediate value and to the input data value of a mutually-distinct and separate one of said input shift-register positions, and
  (2) comparing the given input data value with said intermediate value, and then producing an individual comparison signal having a value of logic 1 when the given input value is larger than said intermediate value, said individual comparison signal having a value of logic zero otherwise;

(D) a summation network, responsive to all of said individual comparison signals, said summation network adding all of the logic ones from said individual comparators and generating an output count signal indicative of the resulting total;

(E) a selectable rank generator, for generating a rank-count signal indicative of a median ranking quantity $M=(R+1)/2$;

(F) a rank comparator, responsive to said output count signal and to said rank-count signal, said rank comparator comparing said rank-count signal to said output count signal and producing a relative-rank signal having a logic level one when said rank-count signal is greater than said output count signal, said relative-rank signal having a logic level zero when said rank-count signal is equal to or less than said output count signal, and also producing a complement relative-rank signal having a logic level complementary to that of said relative-rank signal;

(G) a state-transition flip-flop having a first input responsive to said relative-rank signal and a second input responsive to said complement relative-rank signal; said state-transition flip flop producing a value-adjustment output signal whose value is a logic one when said rank-count signal is greater than said output count signal, said value-adjustment signal being a logic zero otherwise;

(H) a magnitude-change shift register, having first through (N+2)nd shift register positions, and producing first through (N+2)nd magnitude output signals each of which indicates the logically-true value of a corresponding one of said first through (N+2)nd shift register positions, and producing also at least a first through Nth complement magnitude output signals, each of which takes on the logical complement value of a corresponding one of said first through Nth shift register positions, with said (N+1)st output signal being used as an output-transfer signal, and said (N+2)nd output signal being used as an initialization signal; where the successive first through Nth magnitude output signals comprise the successive, most-significant through least-significant bits of a magnitude-change value, where at the start of the overall cyclic operation for any given data set, said magnitude register is initialized with logic zeros in all of said register positions except for the second which receives a logic one, and where at the completion of any given cycle, said single logic one is shifted to the next succeeding register position;

(I) a multiplexer, responsive to said first through Nth logical-true magnitude output signals, to said first through Nth logical-complement magnitude output signals, and to said value-adjustment signal from said state-transition flip flop, said multiplexer producing first through Nth output signals, with said N multiplexer output signals being the same as said first through Nth logical-true signals when said value-adjustment signal is logic zero, while being equal to said first through Nth logical-complement signals when said value-adjustment signal is logic one;

(J) a value-adjustment adder, responsive to said first through Nth multiplexer output signals, to said intermediate-value-carrying first through Nth output signals from said intermediate value storage register, and to said value-adjustment signal from said state-transition flip flop, said adder
  (1) summing said multiplexer signals with said intermediate value signals, while summing said value-adjustment logic one or logic zero with the least-significant bit of the sum produced by adding said two sets of output signals, and
  (2) producing an N-digit output signal indicative of the result of the input summations;

said intermediate value storage register being responsive to said value-adjustment adder and receiving said adder output signal as a new intermediate value; with the given operating cycle being completed upon said receipt of said adder output signal by said intermediate register, and with said overall apparatus then executing its next operating cycle which begins with said R individual comparators utilizing said new intermediate value to perform said comparison and production; and (K) an output register, responsive to said intermediate-value-carrying first through Nth output bit positions of said intermediate value storage register, and to said output-transfer signal from said (N+1)st shift-register position of said magnitude-change shift register, said output register outputting said intermediate value upon receipt of said output-transfer signal when said magnitude register shifts said single logic one to said (N+1)st shift-register position, the intermediate value thus outputted being that which remains in said intermediate value storage register after the completion of said (N−1) iterative operating cycles, with said outputted value approximating the desired median data value with an accuracy of plus or minus 1;

(L) said input shift register, said intermediate value storage register, and said magnitude-change shift register all being responsive to said initialization signal, said signal causing:
  (1) existing values to be shifted in said input register and also causing the next number in said data sequence to be applied to said input register;
  (2) the existing contents of said intermediate value storage register to be cleared and said register to be initialized with a logic one in said first storage position and logic zeros in all other of said storage positions;
  (3) said magnitude-change shift register to be initialized with a logic one in said second register position and logic zeros in all other of said storage positions;

whereby, when said single logic one of said magnitude-change register shifts to said (N+2)nd register position, said apparatus is prepared to formulate the next median value, with said input register containing a new subject set of R data numbers, with said intermediate value register containing the initial approximation of $2^{(N-1)}$, and with said magnitude-change register containing an initial magnitude-change value of $2^{(N-2)}$.

* * * * *